US012615843B2

(12) United States Patent
Xu et al.

(10) Patent No.: US 12,615,843 B2
(45) Date of Patent: Apr. 28, 2026

(54) METHOD FOR PREPARING DISPLAY SUBSTRATE AND DISPLAY SUBSTRATE

(71) Applicant: HKC CORPORATION LIMITED, Shenzhen (CN)

(72) Inventors: Zhongxie Xu, Shenzhen (CN); Haoxuan Zheng, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 573 days.

(21) Appl. No.: 18/091,322

(22) Filed: Dec. 29, 2022

(65) Prior Publication Data

US 2024/0006421 A1     Jan. 4, 2024

(30) Foreign Application Priority Data

Jun. 29, 2022     (CN) .......................... 202210757850.0

(51) Int. Cl.
H01L 27/12          (2006.01)
H01L 23/00          (2006.01)
(Continued)

(52) U.S. Cl.
CPC ............. H10D 86/60 (2025.01); H01L 24/03 (2013.01); H01L 24/05 (2013.01); H01L 25/167 (2013.01); H10D 86/0231 (2025.01); H10D 86/443 (2025.01); H01L 24/06 (2013.01); H01L 24/08 (2013.01); H01L 2224/02255 (2013.01); H01L 2224/03005 (2013.01);
(Continued)

(58) Field of Classification Search
CPC .............................. H01L 25/167; H01L 23/60
See application file for complete search history.

(56) References Cited

U.S. PATENT DOCUMENTS

| 2020/0203420 A1* | 6/2020 | Wu ...................... H01L 23/5386 |
| 2021/0111324 A1* | 4/2021 | Chung ............... H10H 20/8506 |
| 2021/0225896 A1* | 7/2021 | Li ......................... H10D 89/911 |

FOREIGN PATENT DOCUMENTS

| CN | 109285460 A | 1/2019 |
| CN | 209627827 U | 11/2019 |

OTHER PUBLICATIONS

Chinese First Office Action, Chinese Application No. 202210757850.0, mailed Jul. 13, 2023 (11 pages).
(Continued)

*Primary Examiner* — Kretelia Graham
*Assistant Examiner* — David J Goodwin

(57)          ABSTRACT

Disclosed is a method for preparing a display substrate, including: providing a driving substrate; wherein the driving substrate includes: a base substrate; a pixel driving circuit layer; a first pad and a second pad, spaced from each other, and connected to the pixel driving circuit layer; and an electrostatic protection alignment, spaced from the first pad; and transferring a light-emitting element to the driving substrate, such that an anode of the light-emitting element is connected in alignment with the first pad and a cathode of the light emitting-element is connected in alignment with the second pad. The first pad includes a first toothed tip arranged on a side of the first pad facing the electrostatic protection alignment, and the electrostatic protection alignment includes a second toothed tip arranged on a side of the electrostatic protection alignment facing the first pad.

19 Claims, 10 Drawing Sheets

(51) Int. Cl.

| | |
|---|---|
| *H01L 23/62* | (2006.01) |
| *H01L 25/16* | (2023.01) |
| *H10D 86/01* | (2025.01) |
| *H10D 86/40* | (2025.01) |
| *H10D 86/60* | (2025.01) |

(52) U.S. Cl.
CPC ................. *H01L 2224/0347* (2013.01); *H01L 2224/05552* (2013.01); *H01L 2224/05573* (2013.01); *H01L 2224/06132* (2013.01); *H01L 2224/08145* (2013.01); *H01L 2924/12041* (2013.01)

(56) References Cited

OTHER PUBLICATIONS

Notification to Grant Patent Right for Invention, Chinese Application No. 202210757850.0, mailed Aug. 11, 2023 (6 pages).

* cited by examiner

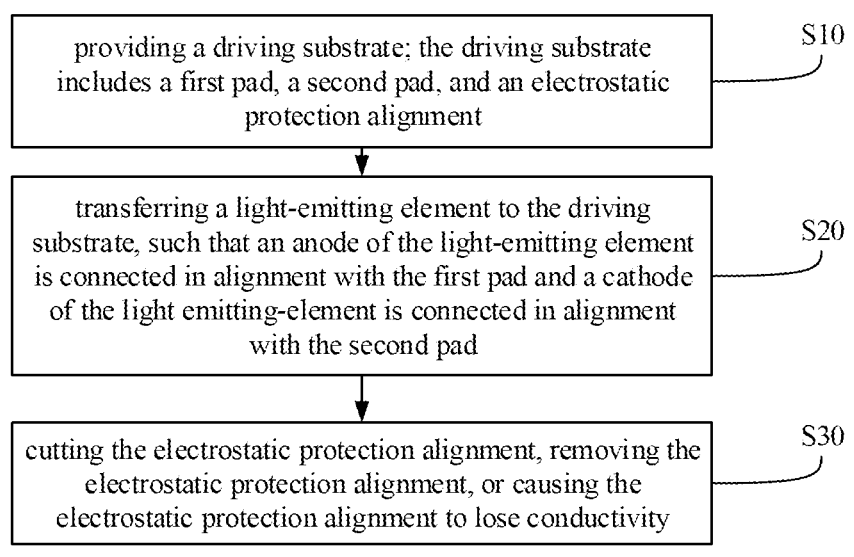

providing a driving substrate; the driving substrate includes a first pad, a second pad, and an electrostatic protection alignment — S10 transferring a light-emitting element to the driving substrate, such that an anode of the light-emitting element is connected in alignment with the first pad and a cathode of the light emitting-element is connected in alignment with the second pad — S20 cutting the electrostatic protection alignment, removing the electrostatic protection alignment, or causing the electrostatic protection alignment to lose conductivity — S30

FIG. 1

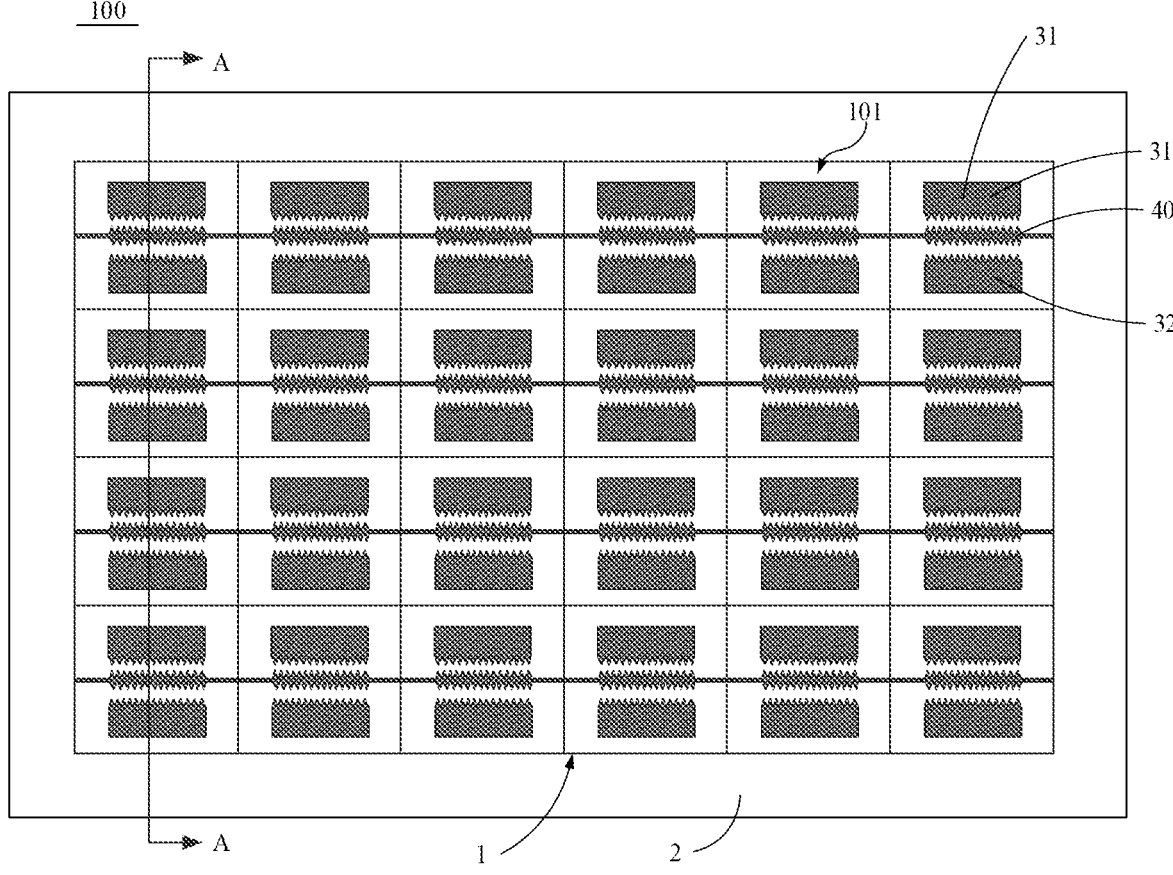

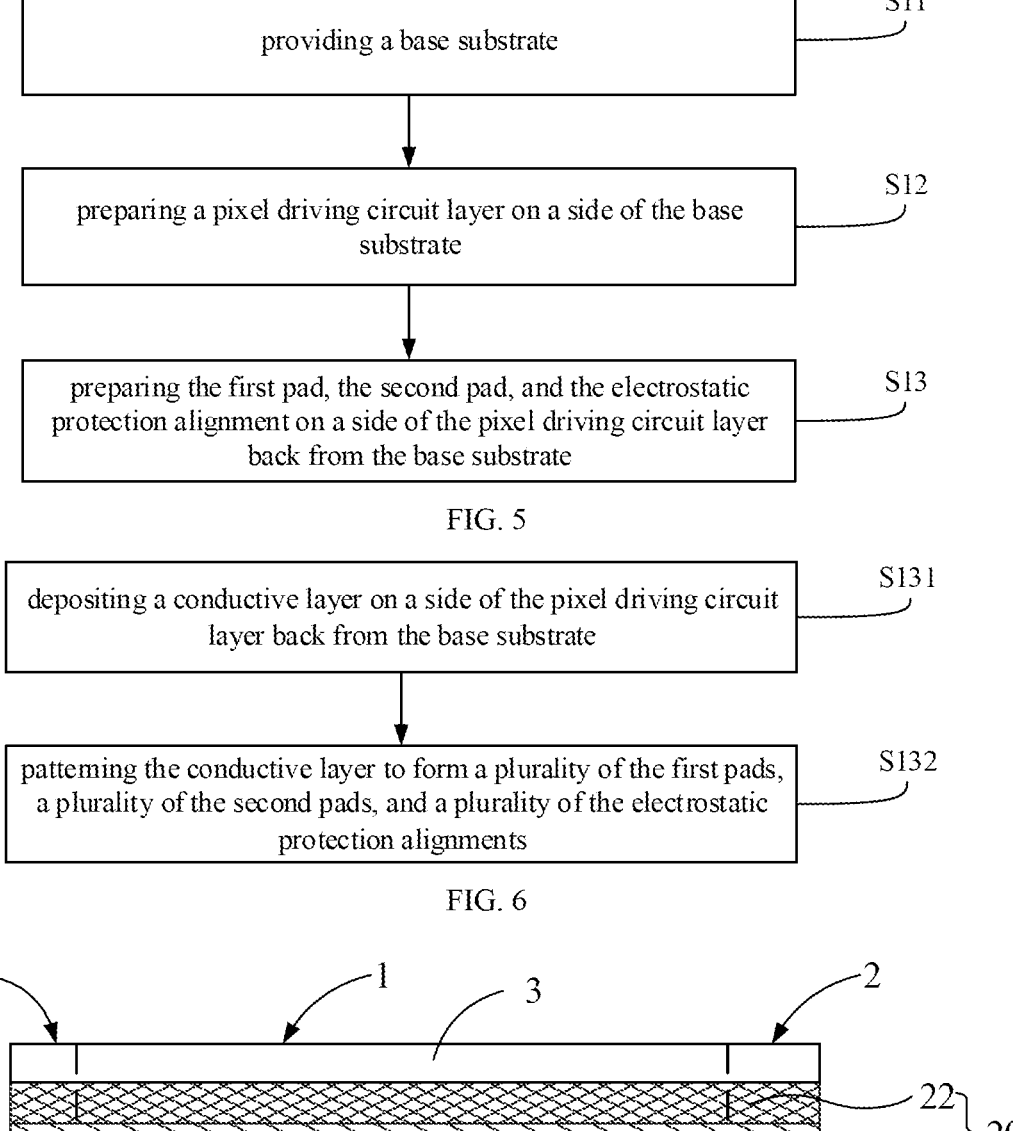

| | |
|---|---|
| providing a base substrate | S11 |
| ↓ | |
| preparing a pixel driving circuit layer on a side of the base substrate | S12 |
| ↓ | |
| preparing the first pad, the second pad, and the electrostatic protection alignment on a side of the pixel driving circuit layer back from the base substrate | S13 |

FIG. 5

| | |
|---|---|
| depositing a conductive layer on a side of the pixel driving circuit layer back from the base substrate | S131 |
| ↓ | |
| patterning the conductive layer to form a plurality of the first pads, a plurality of the second pads, and a plurality of the electrostatic protection alignments | S132 |

METHOD FOR PREPARING DISPLAY SUBSTRATE AND DISPLAY SUBSTRATE

CROSS REFERENCE

The present application claims priority of Chinese Patent Application No. 202210757850.0, filed on Jun. 29, 2022, the entire contents of which are hereby incorporated by reference in its entirety.

TECHNICAL FIELD

The present disclosure relates to the field of display technologies, and in particular to a method for preparing a display substrate and a display substrate.

BACKGROUND

A micro light-emitting diode (Micro LED) display device has the advantages of high contrast, fast response, wide viewing angle, wide color gamut, high brightness, low power consumption, long life, and good stability. With the progress of LED chip technology, the Micro LED display technology has become one of the most competitive image display technologies for the next generation.

Conventionally, due to the large number of light-emitting elements required for a display substrate, in a process of preparing the display substrate, it is necessary to transfer the array-arranged light-emitting elements from an original substrate to a driving substrate. In this transfer process, a large number of light-emitting elements are required to be continuously transferred to the driving substrate. Inevitably, the light-emitting elements and the driving substrate will be constantly moved, rubbed, adsorbed, pressurized, heated, lighted, separated, etc., continuously generating electrostatic charge. While the driving substrate and chip substrates of the light-emitting elements are generally made of insulating material, and a large number of electrostatic charge cannot escape in a timely manner and are accumulated in the light-emitting elements and a pad of the driving substrate. When the light-emitting elements is in contact with the pad of the driving substrate, electrostatic breakdown phenomenon is prone to occurring, leading to the damage of the driving substrate or light-emitting elements, and this damage is prone to occurring on a large scale and is difficult to repair.

SUMMARY OF THE DISCLOSURE

The present disclosure provides a driving substrate, a display substrate, and a method for preparing a display substrate, to solve the problem of a damage to the driving substrate or the light-emitting element caused by the electrostatic breakdown when the light-emitting element and pads of the driving substrate are in contact.

A technical solution is to provide a method for preparing a display substrate, including: providing a driving substrate; wherein the driving substrate includes: a base substrate; a pixel driving circuit layer, arranged on the base substrate; a first pad and a second pad, spaced from each other, arranged on a side of the pixel driving circuit layer away from the base substrate, and connected to the pixel driving circuit layer; and an electrostatic protection alignment, spaced from the first pad; wherein the first pad includes a first toothed tip arranged on a side of the first pad facing the electrostatic protection alignment, and the electrostatic protection alignment includes a second toothed tip arranged on a side of the electrostatic protection alignment facing the first pad; and transferring a light-emitting element to the driving substrate, such that an anode of the light-emitting element is connected in alignment with the first pad and a cathode of the light emitting-element is connected in alignment with the second pad.

Another technical solution is to provide a display substrate, including: a driving substrate, including: a base substrate; a pixel driving circuit layer, arranged on the base substrate; a first pad and a second pad, spaced from each other, arranged on a side of the pixel driving circuit layer away from the base substrate, and connected to the pixel driving circuit layer; and an electrostatic protection alignment, spaced from the first pad; wherein the first pad comprises a first toothed tip arranged on a side of the first pad facing the electrostatic protection alignment, and the electrostatic protection alignment includes a second toothed tip arranged on a side of the electrostatic protection alignment facing the first pad; and a light-emitting element; wherein an anode of the light-emitting element is connected in alignment with the first pad and a cathode of the light emitting-element is connected in alignment with the second pad.

BRIEF DESCRIPTION OF THE DRAWINGS

FIG. 1 is a flowchart of a method for preparing a display substrate according to an embodiment of the present disclosure.

FIG. 2 is a top structural schematic view of a driving substrate provided by S10 as shown in FIG. 1 according to an embodiment of the present disclosure.

FIG. 5 is a flowchart of S10 shown in FIG. 1.

FIG. 6 is a flowchart of S13 shown in FIG. 4.

FIG. 7a is a structural schematic view of a conductive layer deposited on a pixel driving circuit layer in S131.

REFERENCE NUMERALS DESCRIPTION

Figures 3, 4:
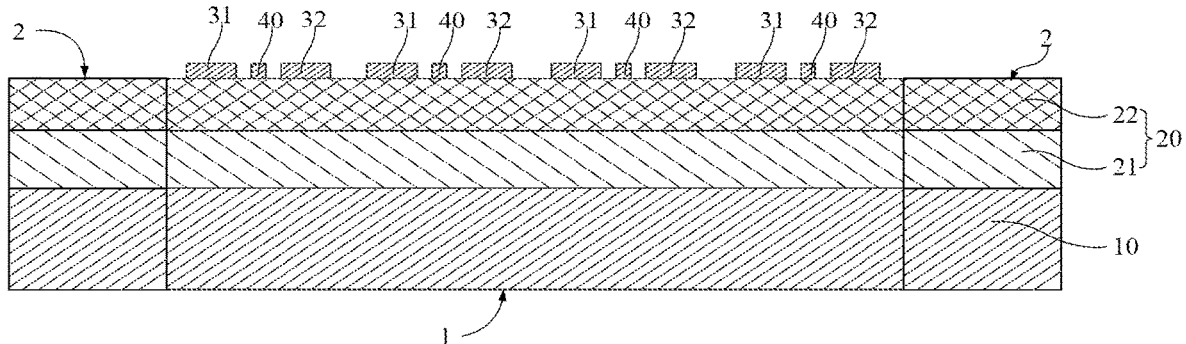
FIG. 3 is a cross-sectional structural schematic view of FIG. 2 along an A-A direction.
FIG. 4 is a structural schematic view of a first pad, a second pad, and an electrostatic protection alignment in a pixel region shown in FIG. 2.

1—display region; 2—non-display region; 201—first side; 202—second side; 3—conductive layer; 100—driving substrate; 10—base substrate; 20—pixel driving circuit layer; 21—circuit structure layer; 22—top insulating layer; 31—first pad; 32—second pad; 311—first toothed tip; 40—electrostatic protection alignment; alignment; 401—second toothed tip; 321—third toothed tip; 402—fourth toothed tip; 101—pixel region; 11—row pixel region; 41—first shorting section; 42—second shorting section; 51—first through hole; 52—second through hole; 53—third through hole; 200—light-emitting element.

DETAILED DESCRIPTION

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative efforts shall fall within the scope of the present disclosure.

The terms "first", "second", and "third" in the present disclosure are intended for descriptive purposes only and are not to be construed as indicating or implying relative importance or implicitly specifying the number of indicated technical features. Therefore, a feature defined with "first", "second", or "third" may explicitly or implicitly include at least one such feature. In the description of the present disclosure, "plurality" means at least two, e.g., two, three, etc., unless otherwise expressly and specifically limited. All directional indications (such as up, down, left, right, forward, backward) in the present disclosure are intended only to explain the relative position relationship, movement, etc. between components in a particular attitude (as shown in the accompanying drawings). If the particular attitude is changed, the directional indications are changed accordingly. In addition, the terms "include" and "have" and any variations thereof are intended to cover non-exclusive inclusion. For example, a process, method, system, product, or apparatus including a series of steps or units is not limited to the listed steps or units, but optionally further includes steps or units not listed, or optionally further includes other steps or units inherent to the process, method, product, or apparatus.

References herein to "embodiments" mean that particular features, structures, or characteristics described in connection with an embodiment may be included in at least one embodiment of the present disclosure. The presence of the phrase at various points in the specification does not necessarily mean the same embodiment, nor is it a separate or alternative embodiment that is mutually exclusive with other embodiments. It is understood, both explicitly and implicitly, by those skilled in the art that the embodiments described herein may be combined with other embodiments.

The present disclosure will be described in detail below in conjunction with the accompanying drawings and embodiments.

Referring to FIG. 1, FIG. 1 is a flowchart of a method for preparing a display substrate according to an embodiment of the present disclosure. The method includes the following operations at blocks illustrated herein.

At block S10: providing a driving substrate 100; the driving substrate 100 includes a first pad 31, a second pad 32, and an electrostatic protection alignment 40.

At block S20: transferring a light-emitting element 200 to the driving substrate 100, such that an anode of the light-emitting element 200 is connected in alignment with the first pad 31 and a cathode of the light emitting-element 200 is connected in alignment with the second pad 32.

Referring to FIG. 2 and FIG. 3, FIG. 2 is a top structural schematic view of a driving substrate provided by S10 as shown in FIG. 1 according to an embodiment of the present disclosure, and FIG. 3 is a cross-sectional structural schematic view of FIG. 2 along an A-A direction. The step S10 provides the driving substrate 100 configured to provide a driving signal to the light-emitting element 200, for driving the light-emitting element 200 to emit light to display a target image.

As shown in FIGS. 2-3, the driving substrate 100 includes a base substrate 10, a pixel driving circuit layer 20, the first pad 31, the second pad 32, and the electrostatic protection alignment 40. The pixel driving circuit layer 20 is arranged on a side of the base substrate 10; the first pad 31 and the second pad 32 are arranged on a side of the pixel driving circuit layer 20 back from the base substrate 10 and are electrically connected to the pixel driving circuit layer 20.

As shown in FIG. 2 and FIG. 4, FIG. 4 is a structural schematic view of a first pad, a second pad, and an electrostatic protection alignment in a pixel region shown in FIG. 2. The electrostatic protection alignment 40 is spaced from the first pad 31, the first pad 31 includes a first toothed tip 311 arranged on a side of the first pad 31 facing the electrostatic protection alignment 40, and the electrostatic protection alignment 40 includes a second toothed tip 401 arranged on a side of the electrostatic protection alignment 40 facing the first pad 31. In addition, the electrostatic protection alignment 40 is also spaced from the second pad 32; that is, the electrostatic protection alignment 40 is spaced between the first pad 31 and the second pad 32. The electrostatic protection alignment 40 may be arranged on a same layer with the first pad 31 and the second pad 32, formed by patterned etching; or, the electrostatic protection alignment 40 may be prepared separately from the first pad 31 and the second pad 32, formed on a conductive layer 3 different from the layer where the first pad 31 and the second pad 32 are located, according to actual needs of the preparation.

In the embodiments, the driving substrate 100 is provided; among them, the electrostatic protection alignment 40 is arranged on the driving substrate 100 facing the first pad 31, and the first pad 31 includes the first toothed tip 311 on a side of the first pad 31 facing the electrostatic protection alignment 40; in this way, electrostatic charge accumulated on the driving substrate 100 may be concentrated on the first toothed tip 311, and may be discharged through the first toothed tip 311. In addition, the electrostatic protection alignment 40 includes the second toothed tip 401 on a side of the electrostatic protection alignment 40 facing the first pad 31; in this way, when the electrostatic charge concentrated on the first toothed tip 311 undergo a tip discharge, a current path is formed between the first toothed tip 311 and the second toothed tip 401 facing the first toothed tip 311, such that the electrostatic current is transferred to the electrostatic protection alignment 40 through the current path and dispersed elsewhere through the electrostatic protection alignment 40, thereby avoiding the accumulation of excessive electrostatic charge on the first pad 31 and the second pad 32 arranged on the driving substrate 100 during the transfer of the light-emitting element 200 to the driving substrate 100. Moreover, when the light-emitting element 200 is docked with the first pad 31 and the second pad 32, electrostatic charge accumulated on the light-emitting element 200 may be transferred to the first pad 31 by contacting the first toothed tip 311, and the electrostatic charge on the light-emitting element 200 are neutralized and uncharged through the above-mentioned tip discharge, such that the electrostatic charge on the light-emitting element 200 may also be neutralized and uncharged in time, thereby preventing the driving substrate 100 or the light-emitting element 200 being damaged caused by an electrostatic breakdown phenomenon when the light-emitting element 200 is docked with the first pad 31 and the second pad 32. Moreover, the step of providing the driving substrate 100 can achieve the above technical effect only by arranging the electrostatic protection alignment 40 facing the first pad 31 and forming the first pad 31 and electrostatic protection alignment 40 respectively with a toothed tip facing each other, which is simple to implement with a proper number of processes, such that the preparation is easy to be realized.

Specifically, referring to FIG. 4 and FIG. 5, FIG. 5 is a flowchart of S10 shown in FIG. 1. in the embodiments, the providing the driving substrate 100 in step S10 specifically includes the following operations at blocks illustrated herein.

At block S11: providing a base substrate 10.

At block S12: preparing a pixel driving circuit layer 20 on a side of the base substrate 10; the pixel driving circuit layer 20 includes a plurality of pixel regions 101 on a surface of the pixel driving circuit layer 20, the plurality of pixel regions 101 being arranged in an array (referring to FIG. 2).

At block S13: preparing the first pad 31, the second pad 32, and the electrostatic protection alignment 40 on a side of the pixel driving circuit layer 20 back from the base substrate 10.

As shown in FIG. 4, the first pad 31 and the second pad 32 are formed in each pixel region 101, and the electrostatic protection alignment 40 is spaced from the second pad 32. The second pad 32 includes a third toothed tip 321 arranged on a side of the second pad 32 facing the electrostatic protection alignment 40, and the electrostatic protection alignment 40 includes a fourth toothed tip 402 on a side of the electrostatic protection alignment 40 facing the second pad 32.

In step S11, the base substrate 10 is provided. The base substrate 10 may be in the form of a board, and its shape and size may be set according to actual production needs; for example, the base substrate 10 of the driving substrate 100 is arranged to match a size and a shape of the display substrate. The base substrate 10 may be a flexible substrate or a rigid substrate, which may be selected according to the type of display substrate. Specifically, the material of the base substrate 10 may be an insulating material, such as one or more of glass, resin, organic polymer material, etc. The material of the base substrate 10 may further include a metal material; it can be understood that an insulating layer is also required on the base substrate made of metal to avoid short circuiting with the pixel driving circuit layer 20. Specifically, the base substrate 10 may further include an isolation layer and a bottom insulating layer arranged on the isolation layer. In some embodiments, the base substrate 10 may be in a multi-layer structure, for example, the base substrate 10 may include a substrate layer, an adhesive layer (such as a pressure-sensitive adhesive layer), an isolation layer, and a bottom insulating layer that are arranged in sequence in a laminated manner.

In step S12, the pixel driving circuit layer 20 is prepared on a side of the base substrate 10 provided in step S11. Specifically, as shown in FIGS. 2 and 3, the pixel driving circuit layer 20 may include a circuit structure layer 21 and a top insulating layer 22 covering the circuit structure layer 21; the circuit structure layer 21 includes a plurality of pixel driving circuits arranged in an array for driving the light-emitting elements 200 in the pixels to emit light; the top insulating layer 22 is arranged on a side of the circuit structure layer 21 back from the base substrate 10 and covers the plurality of pixel driving circuits, for protecting the pixel driving circuits from signal interference or damage to the circuit structure. In some embodiments, thin film transistors (TFTs) may be prepared on the base substrate 10, the TFTs being distributed in an array; a signal line layer may be prepared on a side of the TFTs, and the signal line layer may be formed specifically by patterned etching of a metal layer; and the signal line layer is connected to the TFTs in accordance with a connection structure of driving lines to form the pixel driving circuit layer 20. Specifically, the pixel driving circuit layer 20 includes the plurality of pixel regions 101 arranged in an array on the surface of the pixel driving circuit layer 20, and each pixel region 101 corresponds to a pixel driving circuit.

Specifically, in step S12, the signal line layer includes a plurality of VDD signal lines and a plurality of VSS signal lines. The circuit structure layer 21 is in a multi-layer structure, and the VDD signal lines and VSS signal lines may be formed by patterning on a metal layer to provide voltage signals to the pixel driving circuits.

In particular, in step S13: preparing the first pad, the second pad, and the electrostatic protection alignment on a side of the pixel driving circuit layer back from the base substrate, the first pad 31 and the second pad 32 are spaced from each other, arranged on a side of the pixel driving circuit layer away from the base substrate 10, and electrically connected to the pixel driving circuit layer 20. In some embodiments, the first pad 31 and the second pad 32 may be arranged on a side surface of the top insulating layer 22 away from the circuit structure layer 21; specifically, through holes may be defined on the top insulating layer 22, the through holes may be made to correspond to the first pads 31 and the second pads 32 one by one, and the first pad 31 and the second pad 32 may be each electrically connected to the corresponding pixel driving circuit through a corresponding through hole. One pixel driving circuit corresponding to one first pad 31 and one second pad 32, and the one first pad 31 and the one second pad 32 are considered as a group; as shown in FIG. 1, the groups of the first pads 31 and the second pads 32 are also arranged in an array corresponding to the pixel driving circuits distributed in an array.

As shown in FIG. 4, in the embodiments, the electrostatic protection alignment 40 is spaced from the first pad 31. Specifically, the first pad 31 includes the first toothed tip 311 arranged on a side of the first pad 31 facing the electrostatic protection alignment 40, and the electrostatic protection alignment includes the second toothed tip 401 arranged on a side of the electrostatic protection alignment 40 facing the first pad 31, i.e., the first toothed tip 311 and the second toothed tip 401 face each other.

Further, the electrostatic protection alignment 40 is also spaced with the second pad 32, that is, the electrostatic protection alignment 40 is spaced between the first pad 31 and the second pad 32. The second pad 32 includes the third toothed tip 321 arranged on a side of the second pad 32 facing the electrostatic protection alignment 40, and the electrostatic protection alignment 40 includes the fourth toothed tip 402 on a side of the electrostatic protection alignment 40 facing the second pad 32. That is, the first toothed tip 311 faces the second toothed tip 401, and the third toothed tip 321 face the fourth toothed tip 402.

Specifically, when electrostatic charge is generated on the first pad 31 and the second pad 32, the first toothed tip 311 on the first pad 31 and the third toothed tip 321 on the second pad 32 may drive the electrostatic charge to concentrate on the first toothed tip 311 and the third toothed tip 321 due to their tip structure. When the first toothed tip 311 and the third toothed tip 321 accumulate more electrostatic charge, such that the potential is too high and exceeds a threshold value, a tip discharge will occur, and the third toothed tip 321 and the fourth toothed tip 402 facing the first toothed tip 311 and the second toothed tip 401, respectively, may direct the electrostatic current to be dispersed along the electrostatic protection alignment 40. In this way, the electrostatic charge is neutralized in time to avoid the driving substrate 100 or the light-emitting element 200 being damaged caused by the electrostatic breakdown phenomenon when performing step S20, specifically when the light-emitting element 200 is docked with the first pad 31 and the second pad 32. The above damage may specifically be conductive electrodes on the first pad 31 and/or the second pad 32 being melted, the top insulating layer 22 being damaged, electrodes of the light-emitting element 200 being damaged, etc.

Referring to FIG. 6, FIG. 6 is a flowchart of S13 shown in FIG. 4. in the embodiments, the specific preparation steps of the first pad, second pad and electrostatic protection alignment, i.e., step S13, specifically include the following operations at blocks illustrated herein.

At block S131: depositing a conductive layer 3 on a side of the pixel driving circuit layer 20 back from the base substrate 10.

At block S132: patterning the conductive layer 3 to form a plurality of the first pads 31, a plurality of the second pads 32, and a plurality of the electrostatic protection alignments 40; in pixel regions 101, among the plurality of pixel regions 101, located in the same row or column, a corresponding electrostatic protection alignment 40 is arranged between the corresponding first pads 31 and the corresponding second pads 32.

Specifically, referring to FIG. 7a, FIG. 7a is a structural schematic view of a conductive layer deposited on a pixel driving circuit layer in S131. S131 specifically includes: depositing the conductive layer 3 on both a display region 1 and a non-display region 2 on the side of the pixel driving circuit layer back from the base substrate 10.

The pixel driving circuit layer 20 is the pixel driving circuit layer 20 involved in the above-mentioned embodiments, and the pixel driving circuit layer 20 includes the circuit structure layer 21 and the top insulating layer 22 covering the circuit structure layer 21; the conductive layer 3 is deposited on both the display region 1 and the non-display region 2 on a side of the top insulating layer 22 back from the circuit structure layer 21; in the embodiments, the conductive layer 3 may be a metal layer or an indium tin oxide (ITO) layer for forming the first pad 31, the second pad 32, and the electrostatic protection alignment 40.

Figure 7B:
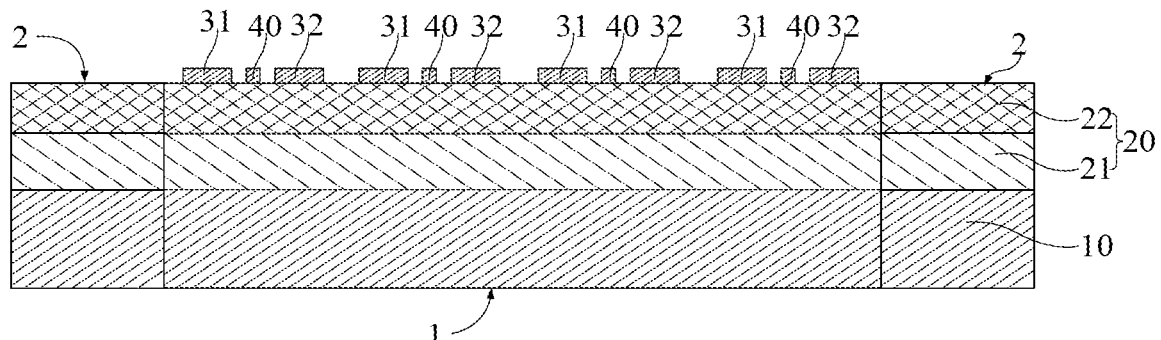
FIG. 7b is a structural schematic view after a first pad, a second pad, and an electrostatic protection alignment is formed in S132.

Referring to FIG. 7b, FIG. 7b is a structural schematic view after a first pad, a second pad, and an electrostatic protection alignment is formed in S132. S132 may be specifically performed by patterning the conductive layer 3 to form the first pads 31, second pads 32, and electrostatic protection alignments Specifically, a photomask etching method may be applied to coat a surface of the conductive layer 3 with a photoresist, expose the photoresist after arranging a photomask or a mask template above the photoresist such that a specific wavelength of light (e.g., UV light) passes through the mask template to irradiate on the photoresist, and develop, etch, and remove the photoresist to form the first pads 31, second pads 32, and electrostatic protection alignments 40 on the conductive layer 3. In the embodiments, the electrostatic protection alignment 40 may share a common mask with the first pad 31 and the second pad 32, and the electrostatic protection alignment 40 is prepared together with the first pad 31 and the second pad 32 to prevent increasing the number of mask templates and the preparation processes.

Specifically, in the same row or column of pixel regions 101, the same electrostatic protection alignment 40 is formed between the first pads 31 and the second pads 32, such that the electrostatic protection alignment sections 40 in multiple pixel regions 101 in the same row or column are connected in series, which may effectively reduce the number of electrostatic protection alignments 40 on the driving substrate 100 and save design space for other devices or structures in the pixel regions 101. In the embodiments, the specific structure and function of the first pad 31, the second pad 32, and the electrostatic protection alignment 40 are the same as or similar to the specific structure and function of the first pad 31, the second pad 32, and the electrostatic protection alignment 40 involved in the above embodiments, and may achieve the same technical effect, for which reference may be made above.

Further, before step S13 or after step S13, the method may further include: electrically connecting the first pad 31 to a VDD signal line and electrically connecting the second pad 32 to a VSS signal line; and electrically connecting the electrostatic protection alignment 40 to the VDD signal line and/or the VSS signal line.

Figure 8:
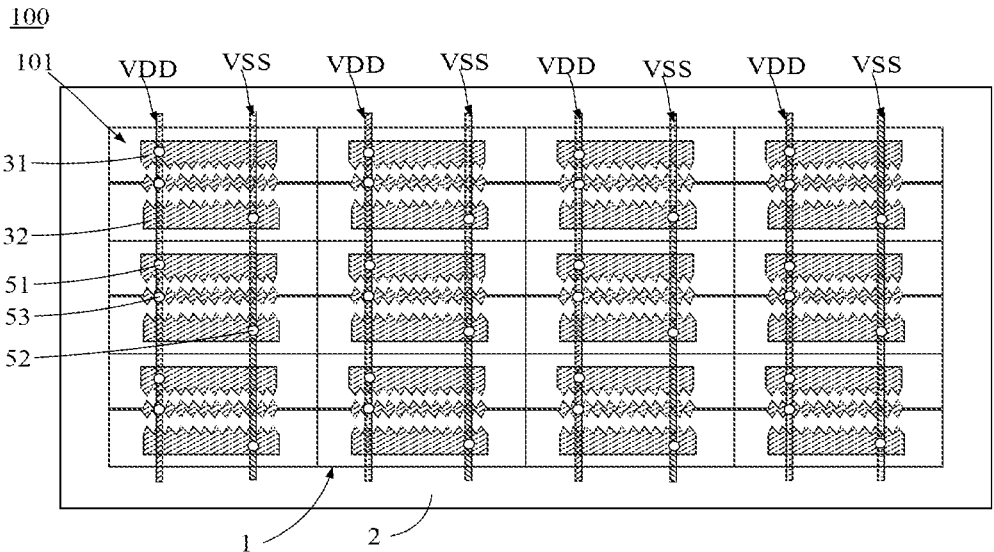
FIG. 8 is a structural schematic view of a driving substrate according to an embodiment of the present disclosure.
Figure 9:
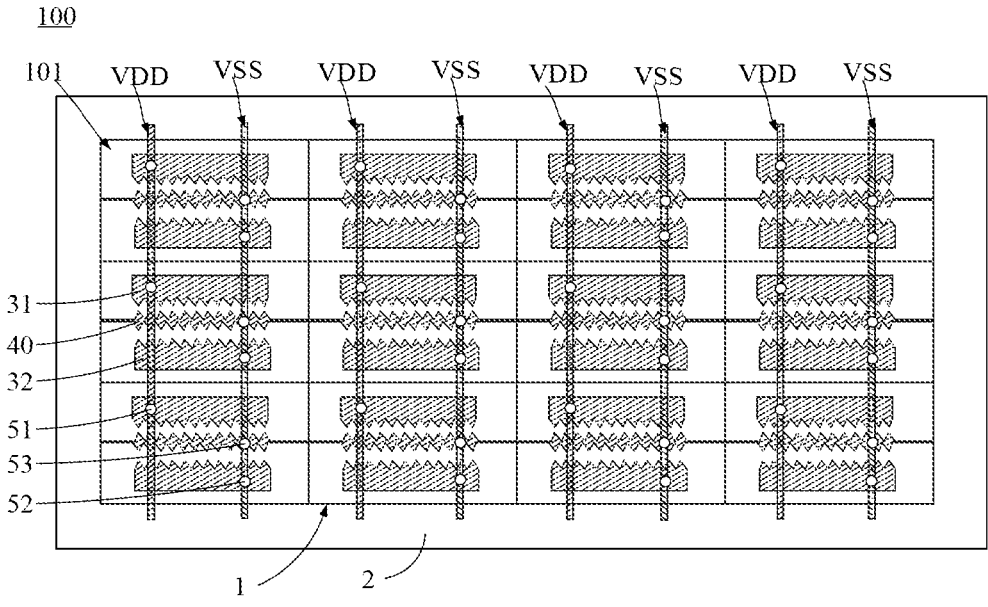
FIG. 9 is a structural schematic view of a driving substrate according to another embodiment of the present disclosure.

Referring to FIG. 8 and FIG. 9, FIG. 8 is a structural schematic view of a driving substrate according to an embodiment of the present disclosure, and FIG. 9 is a structural schematic view of a driving substrate according to another embodiment of the present disclosure. In the embodiments, a plurality of first through-holes 51 may be defined on the top insulating layer 22. The first pad 31 is electrically connected to the VDD signal line through a corresponding one of the first through-holes 51, and the second pad is electrically connected to the VSS signal line through a corresponding one of a plurality of second through-holes 52. Alternatively, corresponding conductive holes and metal alignments may be formed on other insulating layers, and the first pad 31 is electrically connected to the VDD signal line through a corresponding conductive hole and metal alignment, and the second pad 32 is electrically connected to the VSS signal line through a corresponding conductive hole and metal alignment. This step being performed specifically before step S13 or after step S13 may be decided according to the process used. The first pad 31 and the second pad 32 are electrically connected to the VDD signal line and the VSS signal line, respectively, such that the pixel driving circuit layer 20 drives the light emitting element 200 to display an image through the first pad 31 and the second pad 32.

Further, the electrically connecting the electrostatic protection alignment 40 to the VDD signal line and/or the VSS signal line may be achieved by electrically connecting the electrostatic protection alignment 40 to a conductive hole on the insulation layer corresponding to the VDD signal line and/or the VSS signal line, such that the electrostatic current may be conducted to multiple VDD signal lines and/or multiple VSS signal lines along the electrostatic protection alignment 40 through multiple conductive holes, i.e., the electrostatic current may be dispersed through multiple paths and channeled to other locations to allow the electrostatic charge on the first pad and/or the second pad to escape quickly. Specifically, the insulation layer through which the electrostatic protection alignment 40 is electrically connected to the VDD signal line and/or the VSS signal line may be the same insulation layer or a different insulation layer as the insulation layer through which the first pad or the second pad is electrically connected to the VDD signal line or the VSS signal line.

Specifically, as shown in FIGS. 8 and 9, a third through hole 53 is defined in each pixel region 101 among the same row or column of pixel regions 101 corresponding to the same electrostatic protection alignment 40, and the electrostatic protection alignment 40's section in each pixel region 101 is electrically connected to the corresponding VDD signal line and/or VSS signal line through the third through hole 53, which allows the electrostatic charge to be discharged quickly. Alternatively, a third through hole 53 is defined in every a certain number of pixel regions 101 among the same row or column of pixel regions 101 corresponding to the same electrostatic protection alignment 40, and the electrostatic protection alignment 40 is electrically connected to the corresponding VDD signal line and/or VSS signal line through the third through hole 53, which may reduce the number of third through holes 53 and simplify the structure. Of course, only one third through hole 53 is defined for the same row or column of pixel regions 101 corresponding to the same electrostatic protection alignment 40, thereby minimizing the number of third through holes 53 and simplifying the structure.

Figure 10:
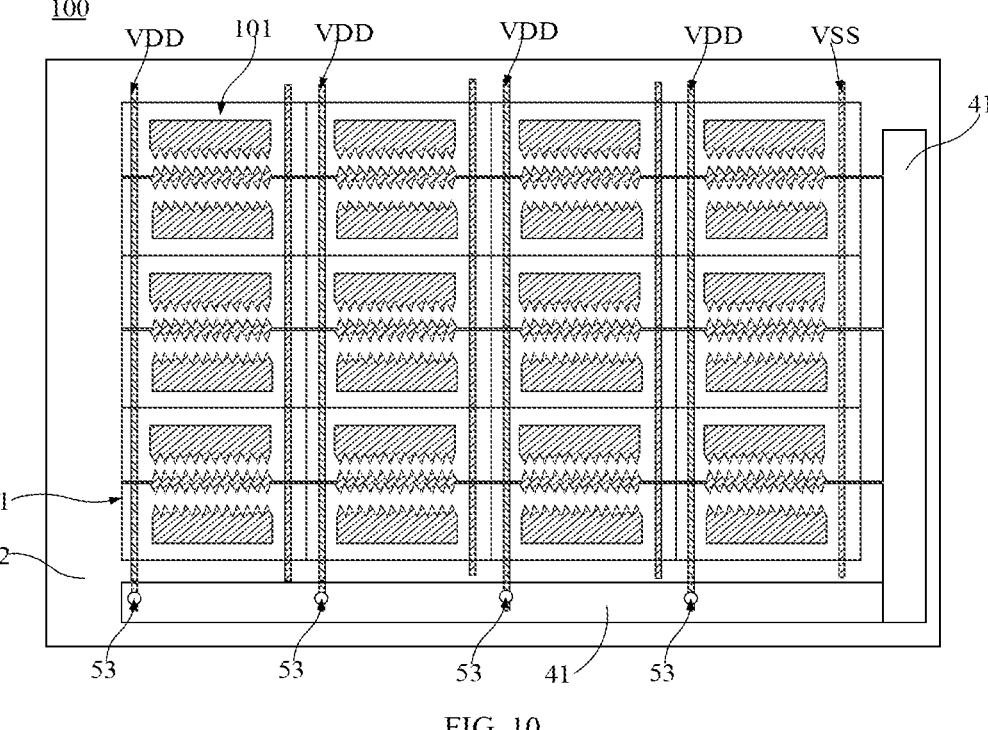
FIG. 10 is a structural schematic view of a driving substrate according to further another embodiment of the present disclosure.

Referring to FIG. 10, FIG. 10 is a structural schematic view of a driving substrate according to further another embodiment of the present disclosure. In the embodiments, to reduce the number of third through holes 53 and simplify the structure, step S132 may include: forming the plurality of the first pads 31, the plurality of the second pads 32, and the plurality of the electrostatic protection alignments 40 in the display region, and forming a first shorting section 41 in the non-display region; an end of each electrostatic protection alignment 40 is shorted by the first shorting section 41.

Specifically, the first shorting section 41 is formed at an end of each electrostatic protection alignment 40 and is formed in the same conductive layer 3 as the electrostatic protection alignment 40. Specifically, the first shorting section 41 is in an "L" shape; the first shorting section 41 is bent towards an end of each VDD/VSS signal line in the non-display region 2 to form the "L" shape, such that a part of the first shorting section 41 is located at the end of each VDD/VSS signal line, and the multiple VDD signal lines or VSS signal lines are shorted to the first shorting section 41 through the third through holes 53 defined on the first shorting section 41. In this way, the electrostatic protection alignments 40 are shorted to the VDD signal lines or VSS signal lines through the first shorting section 41 for dispersing the electrostatic current. In other embodiments, the electrostatic protection alignments 40 may be shorted to other signal lines, such as a ground terminal (GND), a VGate signal line, a VData signal line, etc., through the first shorting section 41.

Correspondingly, step S12 may further include: preparing a plurality of signal lines; an end of each signal line extends to the non-display region and is shorted to the first shorting section.

In the embodiments, the electrostatic protection alignments 40 are shorted to the signal lines of the pixel driving circuit layer 20 through the first shorting section 41, thereby dispersing the electrostatic current. Specifically, the signal lines may include a VDD signal line, a VSS signal line, a VGate signal line, a VData signal line, a GND signal line, etc. The VDD signal line, the VSS signal line, the VGate signal line, the VData signal line, and the GND signal line may be formed specifically by patterning on a multilayer metal layer. An end of each of some of the signal lines extends to the non-display region 2 and is shorted to the first shorting section 41 through a corresponding third through hole 53, thereby allowing the electrostatic currents on the electrostatic protection alignments 40 to be shunted to the some signal lines through the first shorting section 41, for the electrostatic charge to escape through multiple paths.

In other embodiments, the preparing the plurality of signal lines may further include the following.

1) shorting signal lines in a same type in the non-display region 2 through a second shorting section 42. It can be understood the type herein indicates one of a VDD signal line, a VSS signal line, a VGate signal line, a VData signal line, a GND signal line, etc.

2) shorting the second shorting section 42 to the first shorting section 41.

Figure 11:
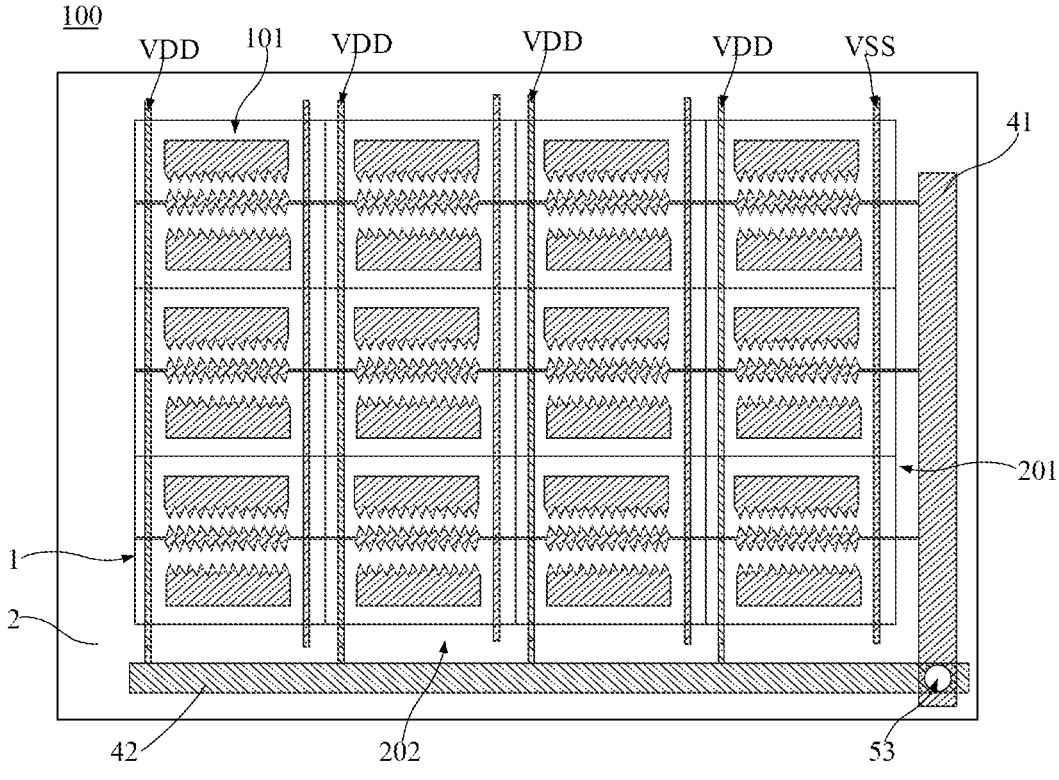
FIG. 11 is a structural schematic view of a driving substrate according to still another embodiment of the present disclosure.
Figure 12:
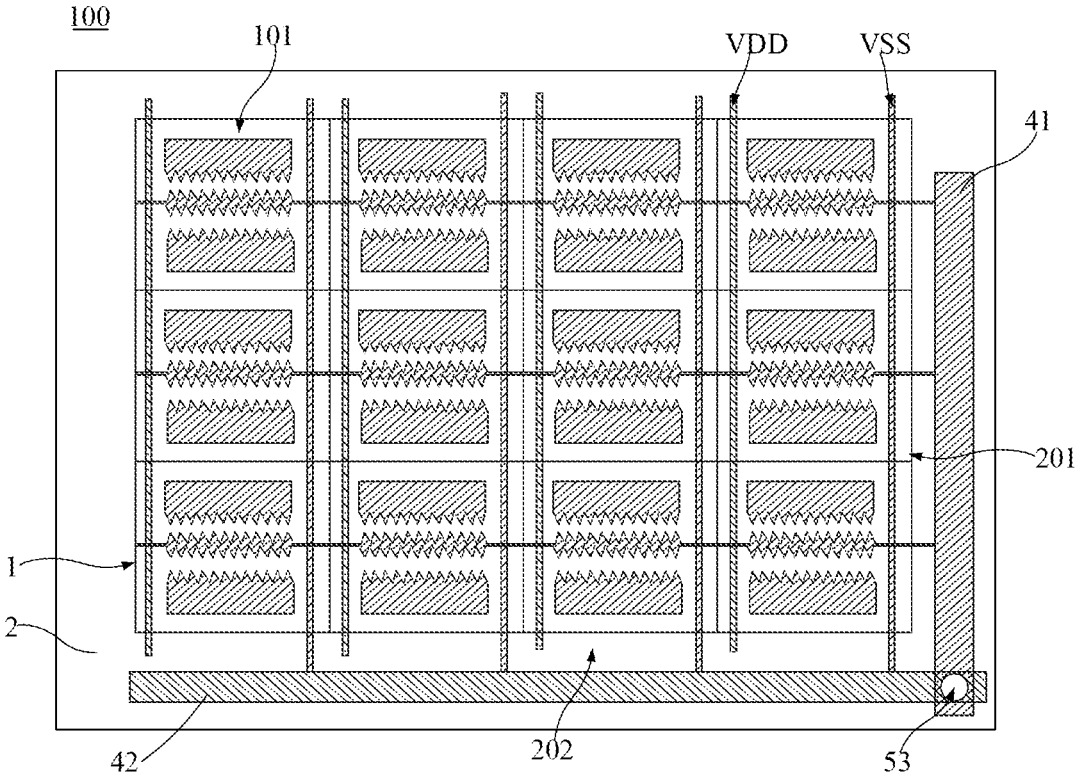
FIG. 12 is a structural schematic view of a driving substrate according to still another embodiment of the present disclosure.

In some embodiments, referring to FIG. 11 and FIG. 12, FIG. 11 is a structural schematic view of a driving substrate according to still another embodiment of the present disclosure, and FIG. 12 is a structural schematic view of a driving substrate according to still another embodiment of the present disclosure. In the embodiments, signal lines in a same type are shorted through the same second shorting section 42; an end of each signal line extends to the non-display region 2, and the second shorting section 42 is arranged in the non-display region 2 to short the signal lines through the second shorting section 42. The second shorting section 42 may be patterned and formed on the same conductive layer 3 as the signal lines to be shorted. Specifically, the first shorting section 41 may be arranged on a first side 201 of the display region 1, the second shorting section 42 is arranged on a second side 202 of the display region 1, and the first side 201 is adjacent to the second side 202 such that the first shorting section 41 and the second shorting section 42 partially overlap. A third through hole 53 is defined on the overlapping region to short the first shorting section 41 to the second shorting section 42 through the third through hole 53. For example, multiple VDD signal lines are shorted through the second shorting section 42 (as shown in FIG. 11), or multiple VSS signal lines are shorted through the second shorting section 42 (as shown in FIG. 12), or multiple VGate signal lines are shorted through the second shorting section 42, and the second shorting section 42 is shorted to the first shorting section 41 through the third through hole 53, thereby making multiple electrostatic protection alignments 40 shorted with signal lines to disperse the electrostatic currents.

It can be understood that when an alignment direction of signal lines (in a same type, such as VDD signal lines or VSS signal lines) is perpendicular to a direction of electrostatic protection alignments 40, the first shorting section 41 may be arranged on the first side 201 of the display region 1, and the second shorting section 42 may be arranged on the second side 202 of the display region 1. The third through hole 53 is defined on the overlapping region of the first shorting section 41 and the second shorting section 42 to short the first shorting section 41 and the second shorting section 42.

Specifically, in some embodiments, the second shorting section 42 and the first shorting section 41 may be located on the same side of the display region 1.

Figure 13A:
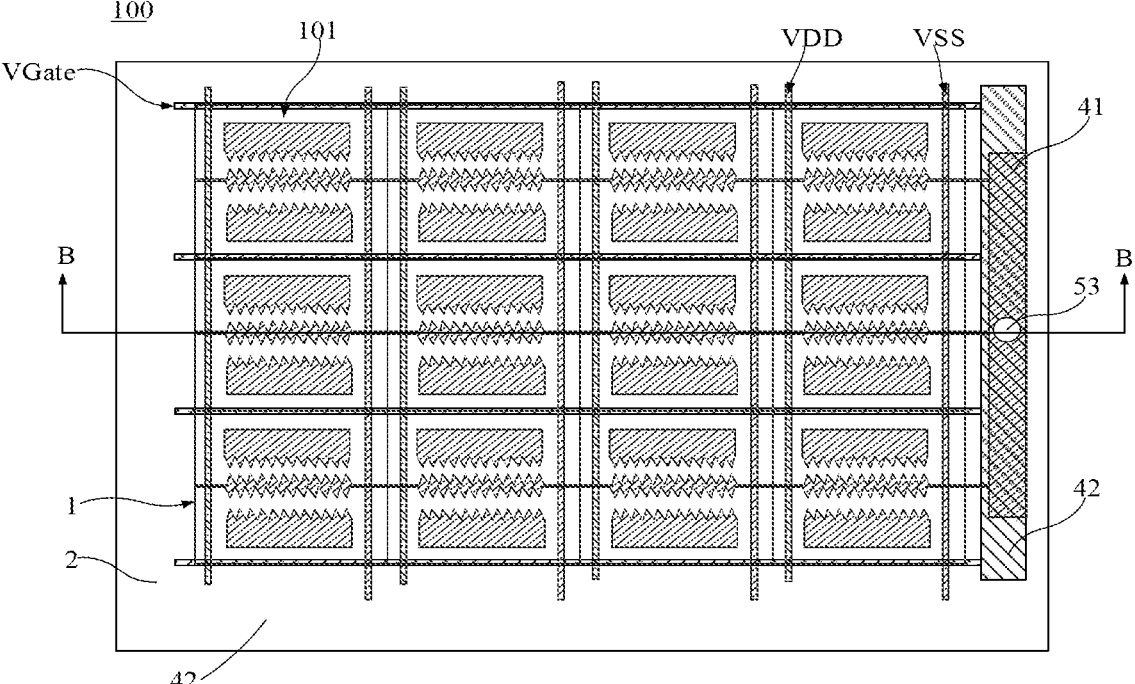
FIG. 13a is a top structural schematic view of a driving substrate according to an embodiment of the present disclosure.
Figure 13B:
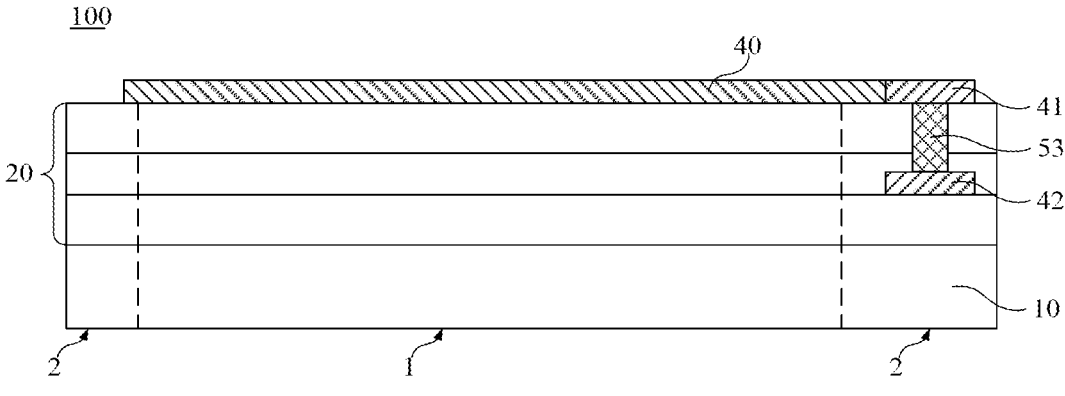
FIG. 13b is a cross-sectional structural schematic view of the driving substrate shown in FIG. 13a along a B-B direction.

Referring to FIG. 13*a* and FIG. 13*b*, FIG. 13*a* is a top structural schematic view of a driving substrate according to an embodiment of the present disclosure, and FIG. 13*b* is a cross-sectional structural schematic view of the driving substrate shown in FIG. 13*a* along a B-B direction, also a schematic longitudinal cross-section of the first shorting section and the second shorting section according to the fifth embodiment of the present disclosure. In the embodiments, an alignment direction of the VGate signal lines is the same as the alignment direction of the electrostatic protection alignments 40. The VGate signal lines are each located at a corresponding boundary line of the pixel regions 101 and extend to the non-display region 2 along the row direction of the array, the second shorting section 42 is formed in the non-display region 2, and an end of each VGate signal line is shorted to the second shorting section 42. The first shorting section 41 and the second shorting section 42 are arranged on different conductive layers 3 on the same side of the display region 1, and the first shorting section 41 is shorted to the second shorting section through a third through hole 53. It should be noted that in the embodiments, the VDD signal line and the VSS signal line are not shown in FIG. 13*b*, only to schematically represent a positional relationship of the electrostatic protection alignments 40 and the first shorting section 41 and the second shorting section 42. In other embodiments, when other signal lines (e.g., VData signal lines, etc.) have the same alignment direction as the VGate signal lines, the other signal lines may be shorted to the second shorting section 42 in a similar manner and shorted to the first shorting section 41 through the second shorting section 42, making the electrostatic protection alignments 40 electrically connected to the other signal lines to disperse the electrostatic currents.

It can be understood that when the alignment direction of signal lines (in a same type, such as VGate signal lines) is the same as the alignment direction of the electrostatic protection alignments 40, the first shorting section 41 and the second shorting section 42 may arranged on the same side of the display region 1. In the embodiments, the electrostatic charge may be discharged to the signal lines through one or a few first through holes 53, thereby effectively reducing the number of through holes and saving more space for other structural designs.

Figure 14:
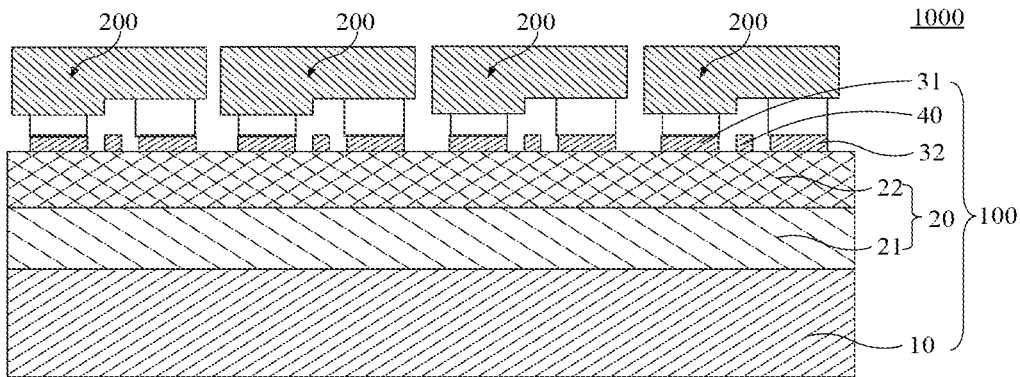
FIG. 14 is a structural schematic view of a display substrate according to an embodiment of the present disclosure.

Referring to FIG. 14, FIG. 14 is a structural schematic view of a display substrate 1000 according to an embodiment of the present disclosure. After the above steps are completed, step S20 is performed to transfer the light-emitting element 200 to the driving substrate 100, such that the anode and cathode of the light-emitting element 200 are connected in alignment to the first pad 31 and the second pad 32, respectively.

Among them, the anode and cathode of the light-emitting element 200 are connected to the first pad 31 and the second pad 32 of the driving substrate 100, respectively, to enable the driving substrate 100 to drive the light-emitting element 200 to emit light. Specifically, the light-emitting element 200 may be a current-driven light-emitting element 200 such as an LED, for example, a Micro LED, a Mini LED, etc. The size of the Mini LED is 50 microns-200 microns and the size of the Micro LED is less than 50 microns. In the embodiments, Micro LED may be adopted as the light emitting element 200 to obtain a Micro LED display substrate.

It can be understood that in the process of transferring the light-emitting elements 200 in bulk to the driving substrate 100, the operation of moving, rubbing, adsorbing, pressurizing, heating, adding light, separating, etc., makes the light-emitting element 200 and the first pad 31 of the driving substrate 100 generate a large amount of electrostatic charge that cannot escape in time. In the embodiments, by preparing the first toothed tip 311 on a side of the first pad 31 facing the electrostatic protection alignment the third toothed tip 321 on a side of the second pad 32 facing the electrostatic protection alignment the second toothed tip 401 on a side of the electrostatic protection alignment 40 facing the first pad 31, and the fourth toothed tip 402 on a side of the electrostatic protection alignment 40 facing the second pad 32, the electrostatic charge may be driven to be concentrated in the first toothed tip 311 and the third toothed tip 321. When the first toothed tip 311 and the third toothed tip 321 accumulate more electrostatic charge such that the potential is too high and exceeds a threshold value, the tip discharge will occur, and the third toothed tip 321 and the fourth toothed tip 402 facing the first toothed tip 311 and the second toothed tip 401, respectively, may direct the electrostatic current to be dispersed along the electrostatic protection alignment 40 to other places (such as VDD signal line, VSS signal line, etc.). In this way, the electrostatic charge is neutralized in time to avoid the driving substrate 100 or the light-emitting element 200 being damaged caused by the electrostatic breakdown phenomenon during the transfer of light-emitting element 200, when the light-emitting element 200 is docked with the first pad 31 and the second pad 32. The above damage may specifically be conductive electrodes on the first pad 31 and/or the second pad 32 being melted, the top insulating layer 22 being damaged, electrodes of the light-emitting element 200 being damaged, etc.

Specifically, the specific method of transferring the light-emitting element 200 to the driving substrate 100 may be referred to the method of transferring the LED to the driving substrate 100 in the related art, which will not be specifically repeated.

It can be understood that due to the existence of electrostatic protection alignments 40 on the driving substrate 100, the electrical connection between the electrostatic protection alignments 40 and signal lines (such as VDD signal line, VSS signal line, VData signal line, VGate signal line, etc.) is prone to causing the display substrate to fail to display properly due to signal abnormalities while in use. Therefore, as shown in FIG. 1, after transferring the light-emitting element 200 to the driving substrate 100, the following operations may be further included.

At block S30: cutting the electrostatic protection alignment 40, removing the electrostatic protection alignment 40, or causing the electrostatic protection alignment 40 to lose conductivity.

It can be understood that since the electrostatic protection alignment 40 or the first shorting section 41 is electrically connected to the signal line in the pixel driving circuit layer 20, it may lead to a shorting of the signal line, resulting in the problem that the display substrate does not display images properly caused by signal abnormalities during operation due to the shorting of the signal line. Therefore, after transferring the light-emitting element 200 to the driving substrate 100, the electrostatic protection alignment 40 is required to be cut off, or removed, or made non-conductive to avoid the above problem. Step S30 may be omitted when the electrostatic protection alignment 40 is not electrically connected to the signal line, or when the electrical connection of the electrostatic protection alignment 40 to the signal line does not cause the display substrate to operate abnormally.

Figure 15:
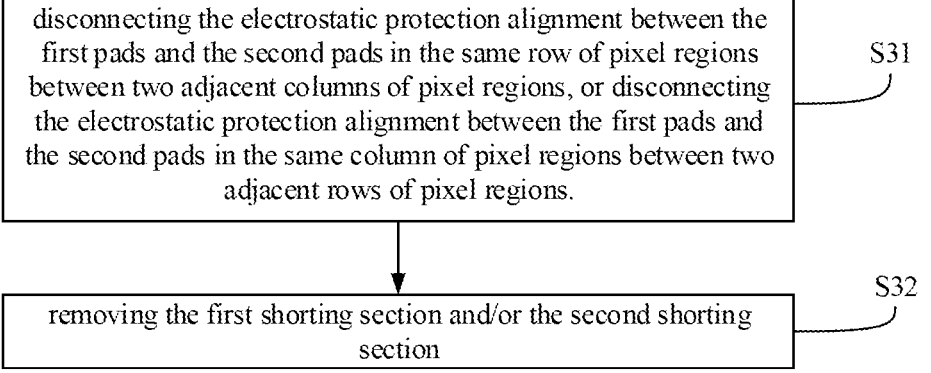
FIG. 15 is a flowchart of S30 shown in FIG. 1.

Specifically, referring to FIG. 15, FIG. 15 is a flowchart of S30 shown in FIG. 1. In the embodiments, step S30 may specifically include the following operations at blocks illustrated herein.

At block S31: disconnecting the electrostatic protection alignment 40 between the first pads 31 and the second pads 32 in the same row of pixel regions 101 between two adjacent columns of pixel regions 101, or disconnecting the electrostatic protection alignment 40 between the first pads 31 and the second pads 32 in the same column of pixel regions 101 between two adjacent rows of pixel regions 101.

At block S32: removing the first shorting section 41 and/or the second shorting section 42.

In the embodiments, the same electrostatic protection alignment 40 between the first pads 31 and the second pads 32 in the same row of pixel regions 101 is cut between two adjacent columns of pixel regions 101, or the same electrostatic protection alignment 40 between the first pads 31 and the second pads 32 in the same column of pixel regions 101 is cut between two adjacent rows of pixel regions 101.

Figure 16:
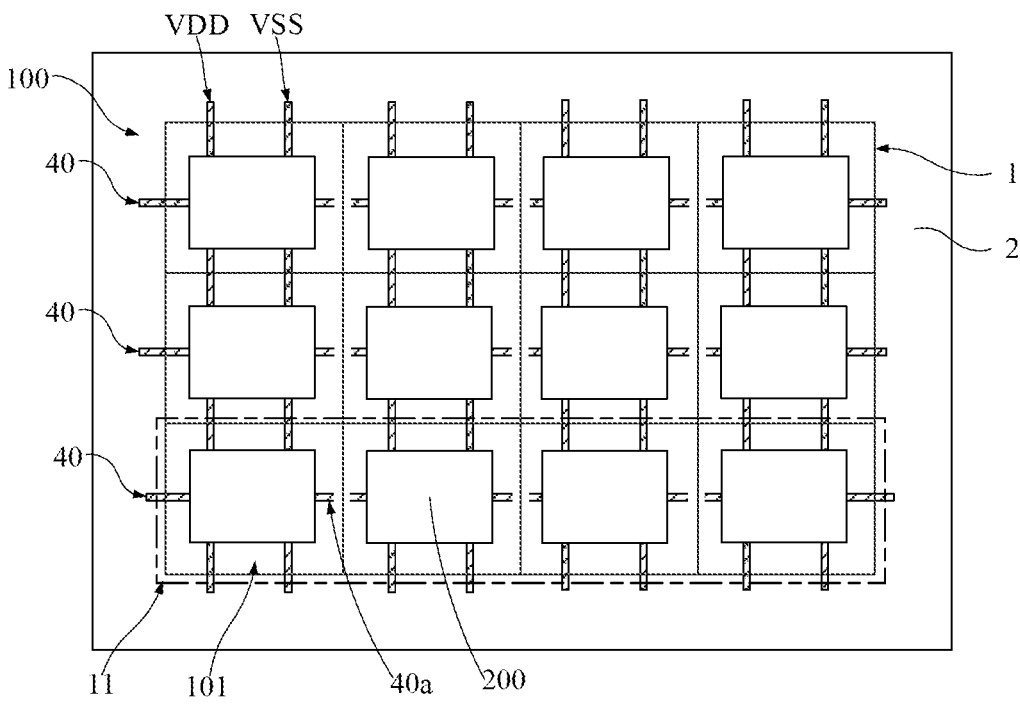
FIG. 16 is a structural schematic view of a display substrate according to another embodiment of the present disclosure.

Referring to FIG. 16, FIG. 16 is a structural schematic view of a display substrate according to another embodiment of the present disclosure. Specifically, a region including same row of pixel regions 101 may be defined as a row pixel region 11, which is applicable in any of the embodiments of the present disclosure. In the row pixel region 11, the same electrostatic protection alignment 40 is arranged between the first pads 31 and the second pads 32, and the electrostatic protection alignment 40 is cut off between the adjacent pixel regions 101, i.e., the electrostatic protection alignment 40 is cut off as a number of sub electrostatic alignments 40a in the row pixel region 11, such that the sub electrostatic alignments 40a in the adjacent pixel regions 101 in the row pixel region 11 are insulated from each other, thereby avoiding the problem of shorting between each signal line (such as VDD signal line, VSS signal line, VData signal line, VGate signal line, etc.) and the electrostatic protection alignment 40 due to the electrostatic protection alignment 40 being electrically connected to the signal lines, and preventing the situation where the display substrate cannot be displayed normally due to signal abnormalities when in use.

It can be understood that when the same electrostatic protection alignment 40 is arranged in the same column of pixel regions 101 on the driving substrate 100, similar to the above-mentioned setting of the same electrostatic protection alignment 40 in the same row of pixel regions 101, a region including the same column of pixel regions 101 may be defined as a column pixel region. In the column pixel region, the electrostatic protection alignment 40 is cut off between adjacent pixel regions 101, thereby avoiding the problem of shorting between each signal line (such as VDD signal line, VSS signal line, VData signal line, VGate signal line, etc.) and the electrostatic protection alignment 40 due to the electrostatic protection alignment 40 being electrically connected to the signal lines, and preventing the situation where the display substrate cannot be displayed normally due to signal abnormalities when in use.

Specifically, the same electrostatic protection alignment 40 between the first pads 31 and the second pads 32 in the same row pixel region 11 may be cut between two adjacent columns of pixel regions 101 by laser cutting, or the same electrostatic protection alignment 40 between the first pads 31 and the second pads 32 in the same column of pixel regions 101 may be cut between two adjacent rows of pixel regions 101 by laser cutting.

Figure 17A:
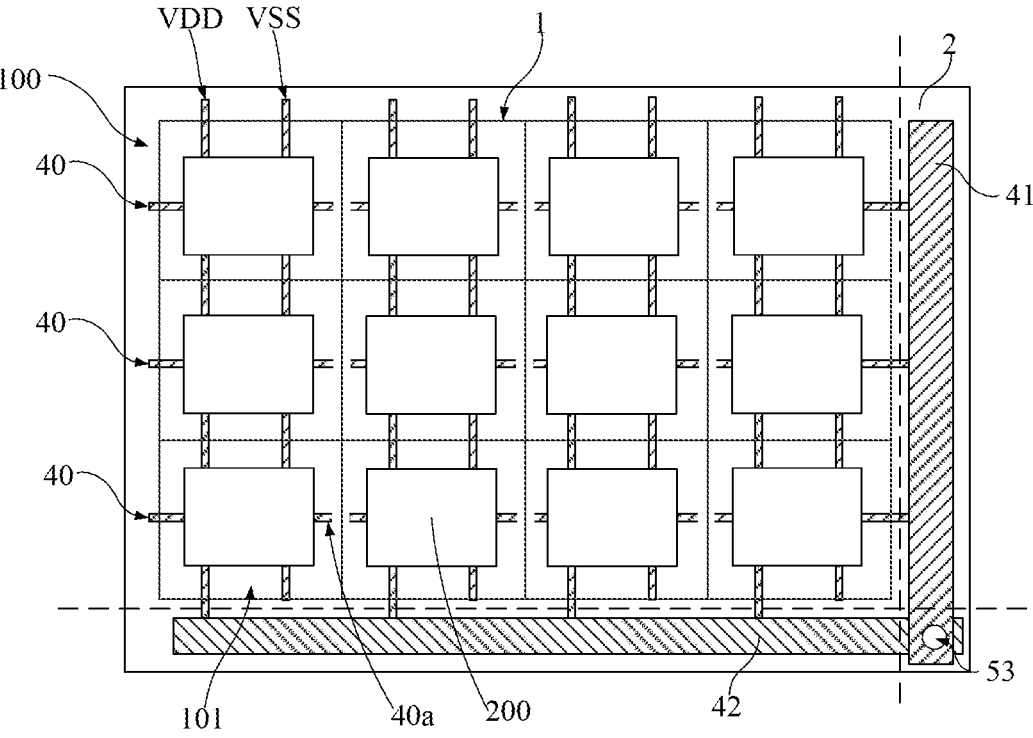
FIG. 17*a* is a structural schematic view of a display substrate, according to further another embodiment of the present disclosure, before a removal of a first shorting section and a second shorting section.
Figure 17B:
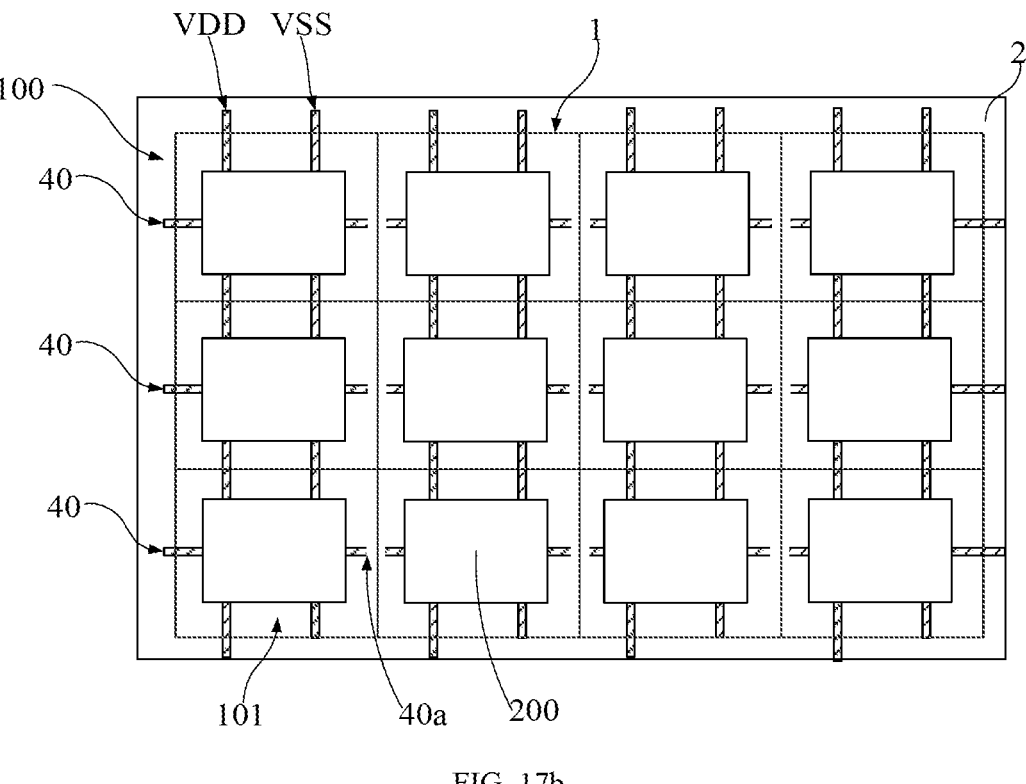
FIG. 17*b* is a structural schematic view of the display substrate shown in FIG. 17*a* after the removal of the first shorting section and the second shorting section.

Referring to FIG. 17a and FIG. 17b, FIG. 17a is a structural schematic view of a display substrate, according to further another embodiment of the present disclosure, before a removal of a first shorting section and a second shorting section, and FIG. 17b is a structural schematic view of the display substrate shown in FIG. 17a after the removal of the first shorting section and the second shorting section. The broken line illustrated in FIG. 17a is a cut line along which the first shorting section 41 and/or the second shorting section 42 of the non-display region 2 is removed to avoid the abnormal wiring of the pixel driving circuit caused by shorting of multiple signal lines of the pixel driving circuit layer 20, and to avoid the display substrate displaying abnormally due to signal abnormalities when in use. It is also possible to reduce the width of the non-display region 2 of the display substrate to achieve narrow bezel of display substrate. It can be understood that in the present disclosure, by setting the first shorting section 41 and/or the second shorting section 42 in the non-display region 2, the electrostatic protection alignment 40 is shorted to the signal line, and the first shorting section 41 and/or the second shorting section 42 is directly removed after the transfer of the light-emitting element 200 is complete. In this way, the risks and process complexity associated with connecting the electrostatic protection alignment 40 to the signal lines by opening holes in the display region 1 may be avoided, thereby simplifying the preparation process.

Further, when preparing the driving substrate 100, i.e., when performing step S10, the electrostatic protection alignment 40 may be coated with a material that can react with the electrostatic protection alignment 40, such as an oxidizer that can react with the electrostatic protection alignment 40, etc., to enable the electrostatic protection alignment 40 to lose conductivity after transferring the light-emitting elements 200 to the driving substrate 100 in bulk, thereby avoiding shorting of the electrodes of the light-emitting element 200 or abnormalities in the wiring of the pixel driving circuit caused by the electrostatic protection alignment 40, and further avoiding the situation that the display substrate cannot be displayed properly due to abnormal signal when in use.

In some embodiments, other ways may be applied to remove the electrostatic protection alignment 40, so as to avoid abnormalities in the wirings of the pixel driving circuit caused by electrical connection of the electrostatic protection alignment 40 and signal lines (such as VDD signal line, VSS signal line, VData signal line, VGate signal line, etc.) due to the existence of electrostatic protection alignment 40, and further avoid the situation that the display substrate cannot be displayed properly due to abnormal signal when in use.

It should be noted that in order to realize the full color of the display substrate, in the embodiments, each three pixel region 101 forms a pixel, and the light-emitting elements 200 connected in the three pixel regions 101 in alignment may correspond to red light, green light and blue light, respectively, so as to realize the full color of the display substrate. Alternatively, three pairs of pads may be arranged in each pixel region 101 of the driving substrate 100. Each pair of pads include a first pad 31 and a second pad 32, and the first pad 31 and the second pad 32 in each pair are connected to the anode and cathode of a light-emitting element 200, respectively; that is, each pixel region 101 is connected in alignment to three light-emitting elements 200, and the three light-emitting elements 200 correspond to red light, green light and blue light respectively, thereby realizing the full color of the display substrate.

The above-mentioned is only the implementation of the present disclosure, not to limit the scope of the present disclosure. Any equivalent structure or equivalent process transformation made by using the content and the attached drawings of the present disclosure, or directly or indirectly applied in other related technical fields, are included in the scope of the present disclosure.

What is claimed is:

1. A method for preparing a display substrate, comprising:
providing a driving substrate; wherein the driving substrate comprises:
a base substrate;
a pixel driving circuit layer, arranged on the base substrate;
a first pad and a second pad, spaced from each other, arranged on a side of the pixel driving circuit layer away from the base substrate, and connected to the pixel driving circuit layer; and
an electrostatic protection alignment, spaced from the first pad; wherein the first pad comprises a first toothed tip arranged on a side of the first pad facing the electrostatic protection alignment, and the electrostatic protection alignment comprises a second toothed tip arranged on a side of the electrostatic protection alignment facing the first pad; and
transferring a light-emitting element to the driving substrate, such that an anode of the light-emitting element is connected in alignment with the first pad and a cathode of the light emitting-element is connected in alignment with the second pad;
wherein the providing a driving substrate comprises:
providing the base substrate;
preparing the pixel driving circuit layer on a side of the base substrate; wherein the pixel driving circuit layer comprises a plurality of pixel regions on a surface of the pixel driving circuit layer, the plurality of pixel regions being arranged in an array; and
preparing the first pad, the second pad, and the electrostatic protection alignment on the side of the pixel driving circuit layer away from the base substrate; wherein the first pad and the second pad are formed in each pixel region, and the electrostatic protection alignment is spaced from the second pad; the second pad comprises a third toothed tip arranged on a side of the second pad facing the electrostatic protection alignment, and the electrostatic protection alignment comprises a fourth toothed tip on a side of the electrostatic protection alignment facing the second pad.

2. The method according to claim 1, wherein the pixel driving circuit layer comprises a circuit structure layer and a top insulating layer covering the circuit structure layer; the circuit structure layer comprises a plurality of pixel driving circuits arranged in an array; the top insulating layer is arranged on a side of the circuit structure layer back from the base substrate and covers the plurality of pixel driving circuits;

wherein the preparing the first pad, the second pad, and the electrostatic protection alignment on the side of the pixel driving circuit layer away from the base substrate comprises:
arranging the first pad and the second pad on a side surface of the top insulating layer away from the circuit structure layer.

3. The method according to claim 2, wherein the arranging the first pad and the second pad on the side surface of the top insulating layer away from the circuit structure layer comprises:
defining a through hole on the top insulating layer corresponding to the first pad and defining another through hole on the top insulating layer corresponding to the second pad, and electrically connecting the first pad and the second pad each to a corresponding pixel driving circuit through a corresponding through hole.

4. The method according to claim 1, wherein the preparing the first pad, the second pad, and the electrostatic protection alignment on the side of the pixel driving circuit layer away from the base substrate comprises:
depositing a conductive layer on a side of the pixel driving circuit layer back from the base substrate; and
patterning the conductive layer to form a plurality of the first pads, a plurality of the second pads, and a plurality of the electrostatic protection alignments; wherein,
the plurality of pixel regions are distributed in a plurality of rows, and each row of pixel regions among the plurality of pixel regions form a row pixel region; in each row pixel region, a corresponding electrostatic protection alignment is arranged between corresponding first pads and corresponding second pads; or
the plurality of pixel regions are distributed in a plurality of columns, and each column of pixel regions among the plurality of pixel regions form a column pixel region; in each column pixel region, a corresponding electrostatic protection alignment is arranged between corresponding first pads and corresponding second pads.

5. The method according to claim 4, wherein,
the preparing the pixel driving circuit layer on the side of the base substrate comprises:
preparing a plurality of VDD signal lines and a plurality of VSS signal lines;
the method further comprises:
electrically connecting each first pad to a corresponding VDD signal line, and electrically connecting each second pad to a corresponding VSS signal line; and
electrically connecting each electrostatic protection alignment to a corresponding VDD signal line and/or a corresponding VSS signal line.

6. The method according to claim 5, wherein the pixel driving circuit layer comprises a circuit structure layer and a top insulating layer covering the circuit structure layer; the circuit structure layer comprises a plurality of pixel driving circuits arranged in an array for driving the light-emitting elements to emit light; the top insulating layer is arranged on a side of the circuit structure layer back from the base substrate and covers the plurality of pixel driving circuits;
wherein the electrically connecting each first pad to the corresponding VDD signal line comprises:
defining a plurality of first through holes on the top insulating layer; and
electrically connecting each first pad to the corresponding VDD signal line through a corresponding first through hole.

7. The method according to claim 6, wherein the electrically connecting each second pad to the corresponding VSS signal line comprises:

defining a plurality of second through holes on the top insulating layer; and electrically connecting each second pad to the corresponding VSS signal line through a corresponding second through hole.

8. The method according to claim 6, wherein the electrically connecting each electrostatic protection alignment to the corresponding VDD signal line and/or the corresponding VSS signal line comprises:

defining a third through hole in each pixel region in each row pixel region; and electrically connecting a section of the corresponding electrostatic protection alignment in each pixel region to the corresponding VDD signal line and/or VSS signal line through the third through hole; or defining a third through hole in each pixel region in each column pixel region; and electrically connecting a section of the corresponding electrostatic protection alignment in each pixel region to the corresponding VDD signal line and/or VSS signal line through the third through hole.

9. The method according to claim 6, wherein the electrically connecting each electrostatic protection alignment to the corresponding VDD signal line and/or the corresponding VSS signal line comprises:

defining a third through hole in every a certain number of pixel regions in each row pixel region; and electrically connecting a section of the corresponding electrostatic protection alignment in each pixel region to the corresponding VDD signal line and/or VSS signal line through the third through hole; or defining a third through hole in every a certain number of pixel regions in each column pixel region; and electrically connecting a section of the corresponding electrostatic protection alignment in each pixel region to the corresponding VDD signal line and/or VSS signal line through the third through hole.

10. The method according to claim 6, wherein the electrically connecting each electrostatic protection alignment to a corresponding VDD signal line and/or a corresponding VSS signal line comprises:

defining a third through hole in each row pixel region; and electrically connecting a section of the corresponding electrostatic protection alignment in each pixel region to the corresponding VDD signal line and/or VSS signal line through the third through hole; or defining a third through hole in each column pixel region; and electrically connecting a section of the corresponding electrostatic protection alignment in each pixel region to the corresponding VDD signal line and/or VSS signal line through the third through hole.

11. The method according to claim 4, wherein, the depositing a conductive layer on the side of the pixel driving circuit layer away from the base substrate comprises:

depositing the conductive layer in both a display region and a non-display region on the side of the pixel driving circuit layer back from the base substrate;

the patterning the conductive layer to form a plurality of the first pads, a plurality of the second pads, and a plurality of the electrostatic protection alignments comprises:

forming the plurality of the first pads, the plurality of the second pads, and the plurality of the electrostatic protection alignments in the display region, and forming a first shorting section in the non-display region; wherein an end of each electrostatic protection alignment is shorted by the first shorting section.

12. The method according to claim 11, after the transferring the light-emitting element to the driving substrate, further comprising:

in each row pixel region, disconnecting the corresponding electrostatic protection alignment between each adjacent two pixel regions; or in each column pixel region, disconnecting the corresponding electrostatic protection alignment between each adjacent two pixel regions; and removing the first shorting section.

13. The method according to claim 11, wherein, the preparing the pixel driving circuit layer on the side of the base substrate comprises:

preparing a plurality of signal lines; wherein an end of each signal line extends to the non-display region and is shorted to the first shorting section;

wherein after the transferring the light-emitting element to the driving substrate, the method further comprises:

removing the first shorting section.

14. The method according to claim 13, wherein, the preparing a plurality of signal lines comprises:

shorting signal lines in a same type among the plurality of signal lines in the non-display region through a second shorting section; and shorting the second shorting section to the first shorting section;

wherein after the transferring the light-emitting element to the driving substrate, the method further comprises:

removing at least one of the first shorting section and the second shorting section.

15. The method according to claim 14, wherein the shorting signal lines in a same type among the plurality of signal lines in the non-display region through a second shorting section comprises:

in condition of an alignment direction of each signal line is the same as an alignment direction of each electrostatic protection alignment, arranging the second shorting section and the first shorting section on a same side of the display region;

in condition of the alignment direction of each signal line is perpendicular to the alignment direction of each electrostatic protection alignment, arranging the first shorting section on a first side of the display region, and arranging the second shorting section on a second side of the display region; wherein the first side is adjacent to the second side, such that the first shorting section and the second shorting section partially overlap.

16. The method according to claim 15, wherein the arranging the second shorting section and the first shorting section on the same side of the display region comprises:

arranging the second shorting section and the first shorting section on different conductive layers on the same side of the display region; wherein the first shorting section is shorted to the second shorting section through a through hole.

17. The method according to claim 1, after the transferring the light-emitting element to the driving substrate, further comprising:

cutting the electrostatic protection alignment, removing the electrostatic protection alignment, or causing the electrostatic protection alignment to lose conductivity.

18. The method according to claim 1, wherein the electrostatic protection alignment is formed on a same layer with the first pad and the second pad.

19. A display substrate, comprising:

a driving substrate, comprising:

a base substrate;

a pixel driving circuit layer, arranged on the base substrate;

a first pad and a second pad, spaced from each other, arranged on a side of the pixel driving circuit layer away from the base substrate, and connected to the pixel driving circuit layer; and an electrostatic protection alignment, spaced from the first pad; wherein the first pad comprises a first toothed tip arranged on a side of the first pad facing the electrostatic protection alignment, and the electrostatic protection alignment comprises a second toothed tip arranged on a side of the electrostatic protection alignment facing the first pad; and a light-emitting element; wherein an anode of the light-emitting element is connected in alignment with the first pad and a cathode of the light emitting-element is connected in alignment with the second pad;

wherein the pixel driving circuit layer is arranged on a side of the base substrate and comprises a plurality of pixel regions on a surface of the pixel driving circuit layer, and the plurality of pixel regions are arranged in an array; and the first pad, the second pad, and the electrostatic protection alignment are arranged on the side of the pixel driving circuit layer away from the base substrate, the first pad and the second pad are formed in each pixel region, and the electrostatic protection alignment is spaced from the second pad; and the second pad comprises a third toothed tip arranged on a side of the second pad facing the electrostatic protection alignment, and the electrostatic protection alignment comprises a fourth toothed tip on a side of the electrostatic protection alignment facing the second pad.

\* \* \* \* \*